United States Patent [19]
Itou et al.

[11] Patent Number: 5,594,279
[45] Date of Patent: Jan. 14, 1997

[54] SEMICONDUCTOR DEVICE HAVING SHIELD WIRING FOR NOISE SUPPRESSION

[75] Inventors: Yutaka Itou; Hidetoshi Iwai, both of Ohme, Japan; Toshiyuki Sakuta, Plano, Tex.; Takumi Nasu, Tsuchiura; Tomohiro Suzuki, Tsukuba, both of Japan

[73] Assignees: Texas Instruments Incorporated, Dallas, Tex.; Hitachi Ltd., Japan

[21] Appl. No.: 149,876

[22] Filed: Nov. 10, 1993

[30]   Foreign Application Priority Data

Nov. 12, 1992 [JP]  Japan .................................. 4-327264

[51] Int. Cl.$^6$ ................................. H01L 23/48
[52] U.S. Cl. ..................... 257/758; 257/630; 257/659; 257/211
[58] Field of Search ................... 257/665, 659, 257/211, 758, 776, 207, 760, 630, 664, 920

[56]   References Cited

U.S. PATENT DOCUMENTS

| | | | |
|---|---|---|---|
| 4,924,293 | 5/1990 | Saito et al. | 257/760 |
| 5,027,176 | 6/1991 | Saika et al. | 257/758 |
| 5,136,357 | 8/1992 | Hesson et al. | 257/659 |
| 5,179,539 | 1/1993 | Horiguchi et al. | 307/296.8 |
| 5,345,105 | 9/1994 | Sun et al. | 257/659 |

FOREIGN PATENT DOCUMENTS

| | | | |
|---|---|---|---|
| 0079775 | 5/1983 | European Pat. Off. | 257/659 |
| 0305001 | 3/1989 | European Pat. Off. | 257/659 |
| 57-21849 | 2/1982 | Japan | 257/659 |
| 57-71165 | 5/1982 | Japan | 257/659 |

*Primary Examiner*—Donald T. Hajec
*Assistant Examiner*—Mark Tremblay
*Attorney, Agent, or Firm*—William E. Hiller; Richard L. Donaldson

[57]   ABSTRACT

A semiconductor device in which shield wiring is arranged between the semiconductor substrate and the power source wiring for supplying the power source potential or ground potential. Noise, as represented by variations in the potential of the semiconductor substrate, is substantially prevented from transferring to the aforementioned power source wiring by the shield wiring. In one aspect, shield wiring 1 is arranged between Vss wiring for supplying potential to the various circuits on the semiconductor substrate and substrate 7. This shield wiring 1 is connected to grounding lead frame 18 via M1 intra-chip wiring 4, M2 intra-chip wiring 5, connecting part 40, bonding pad 3 and bonding wire 8. Since the coupling impedance between shield wiring 1 and substrate 7 (due almost solely to the electrostatic capacitance Css) is large, and coupling impedance between Vss wiring 2 and substrate 7 (due almost solely to the junction capacitance D) is low, the noise caused by variations in the potential of substrate 7 is transferred to shield wiring 1, while it is not appreciably transferred to Vss wiring 2.

10 Claims, 7 Drawing Sheets

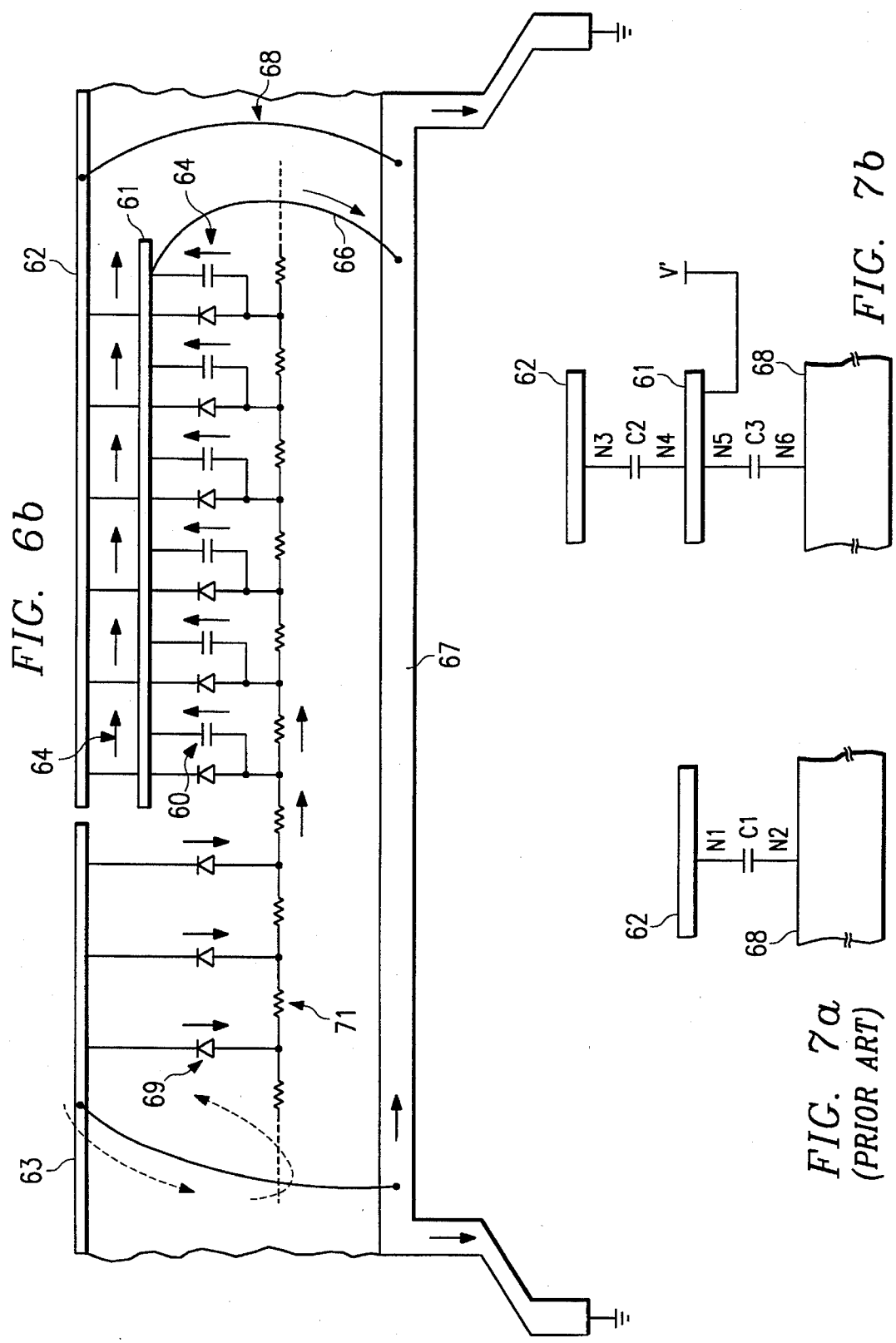

SEMICONDUCTOR DEVICE HAVING SHIELD WIRING FOR NOISE SUPPRESSION

This invention concerns a technique for suppressing noise in a semiconductor device. More specifically, this invention concerns a type of semiconductor device characterized by the fact that the influence of noise caused by variations in the semiconductor substrate voltage can be reduced.

BACKGROUND OF THE INVENTION

For a semiconductor device, as the integration level is increased by reducing the size of the circuit elements and as the voltage of the power source is reduced, erroneous operation due to noise becomes a serious problem. Power supply noise caused by variations in the power source potential or ground potential is particularly troublesome.

In recent years, there has been a tendency to increase the number of bits (×4 configuration, ×8 configuration, ×16 configuration, etc.) in a dynamic random access memory (DRAM), which is a type of a semiconductor memory device. As the number of bits is increased, the number of input and output buffers for performing input/output of the data is increased. Since there is a large current flowing during switching (logic variation) of the output buffer, when data is output in a multiple-bit DRAM, a very large current flows into the semiconductor chip through the lead frame, or a very large current flows from the semiconductor chip. Since there is a parasitic inductance present in the lead frame, when a large current flows in the lead frame, a back electromotive force of the aforementioned parasitic inductance causes a variation in the ground potential. This variation in the power source potential or ground potential is the power source noise.

The circuit portion that is most susceptible to the influence of the power source noise is the input buffer, which may exhibit faulty operation due to power source noise. In the conventional DRAM, the following measures are taken to suppress the influence of power source noise.
(1) A differential amplifier, etc., is used in the input buffer to increase the noise resistance of the input.
(2) More power source pins and ground pins are arranged to reduce power source noise.
(3) By distributing the power source wiring of the input buffer in the semiconductor chip (here, the power source wiring refers to both the wiring for the power source potential and the wiring for the ground potential) to the output buffer and other circuits' power source wiring, the power source noise due to overlap with the power source wiring of the input buffer can be reduced.

However, for an LSI (large scale integration) circuit with a high integration level, there is a tendency to decrease the power source voltage from 5 V to 3.3 V. As the power source voltage is decreased, the proportion of the noise of the same magnitude becomes larger. Consequently, the influence of the power source noise on the input buffer is increased. Also, in order to realize a high speed of operation, a high current is needed for driving. This increase in the driving current is also a reason for the increase in power source noise.

Factors that influence power source noise have been modeled. The results indicate that in addition to the transfer from the lead frame, as considered in the past, the transfer from the semiconductor substrate is also significant. Since a large current flows in the semiconductor chip, the potential of the semiconductor substrate varies, and this variation in the potential of the substrate couples to the power source wiring via the parasitic inductance between the semiconductor substrate and the power source wiring (for both the potential of the power source and the potential of the ground), and the power source noise transferred from the semiconductor substrate takes place due to this overlap. Usually, as the power source wiring is connected to the circuit on the semiconductor substrate, there is a significant coupling impedance between the power source wiring and the semiconductor substrate due to the junction capacitance and mutual inductance. For the aforementioned conventional means for suppressing the power source noise, only the power source noise transferred from the lead frame is taken into consideration; hence, the power source noise transferred from the semiconductor substrate cannot be prevented. This is a problem. Also, variation in the semiconductor substrate potential may be transferred directly to the circuit elements as noise, causing erroneous operation. This is also a problem.

For the semiconductor device, due to operation of the internal circuit arranged on the semiconductor chip, current flow from/to the semiconductor chip through the lead frame increases. Due to the increased current, there is a variation in the potential of the semiconductor substrate of the semiconductor chip; the noise caused by this variation in the potential is transferred to the power source wiring or circuit elements of the semiconductor chip, causing erroneous operation of the circuit.

OBJECT OF THE INVENTION

An object of this invention is to provide a type of semiconductor device characterized by the fact that the noise caused by variation in the potential of the semiconductor substrate can be reduced.

SUMMARY OF THE INVENTION

This invention provides a first semiconductor device characterized by the fact that it has the following parts: a semiconductor substrate on which multiple circuit elements are formed; an insulating layer formed on the upper surface of the aforementioned semiconductor substrate; multiple wiring portions which are arranged on the aforementioned insulating layer and which contain at least power source wiring; shield wiring which is embedded in the aforementioned insulating layer at a position between the aforementioned semiconductor substrate and the aforementioned power source wiring; and a means which applies a fixed potential to the aforementioned shield wiring.

Also, this invention provides a second semiconductor device characterized by the fact that it comprises a semiconductor substrate of the first electroconductive type, a second electroconductive type shield region formed on the aforementioned semiconductor substrate, and multiple circuit elements formed in the first electroconductive type or second electroconductive type regions formed on the aforementioned shield region.

In the first semiconductor device of this invention, shield wiring is arranged between the semiconductor substrate and the power source wiring; shield wiring with a significant parasitic coupling impedance with the semiconductor substrate can absorb the noise caused by the variation in the potential. Consequently, the noise transferred in the power source wiring decreases, and the erroneous operation of the circuit of the semiconductor device can be prevented.

The second semiconductor device of this invention has a shield region between the semiconductor substrate and the region where the circuit elements are formed; the coupling impedance with the semiconductor substrate is small, and the transfer of noise caused by the variation in the potential of the semiconductor substrate to the circuit elements can be reduced by the shield region. In this way, erroneous operation of the semiconductor device can also be prevented.

BRIEF DESCRIPTION OF THE DRAWINGS

FIGS. 6(a)–6(b) are schematic diagrams illustrating the principle of this invention.

FIGS. 7(a)–7(b) are schematic diagrams briefly illustrating the principle of this invention.

Figure 1:
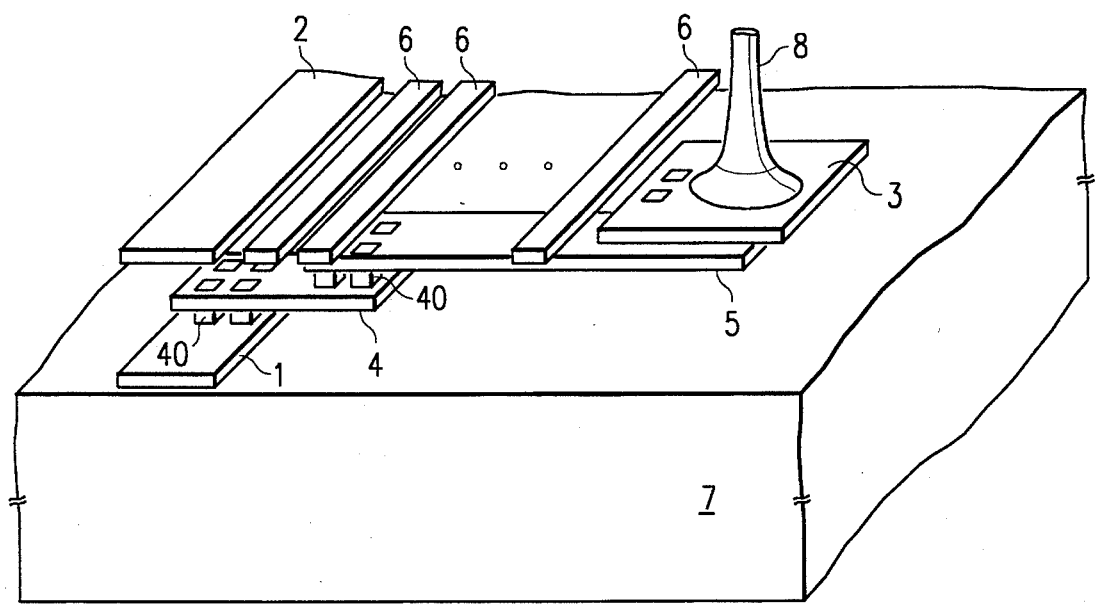
FIG. 1 is a fragmentary perspective view illustrating a first embodiment of the semiconductor device of this invention.

In reference numerals as shown in the drawings:
1, shield wiring
2, Vss wiring
3, bonding pad
4, M1 intra-chip wiring
5, M2 intra-chip wiring
6, channel wiring
7, substrate
8, bonding wire
10, interlayer insulating layer
18, lead frame
40, connecting part

DESCRIPTION OF THE PREFERRED EMBODIMENTS

Figure 4:
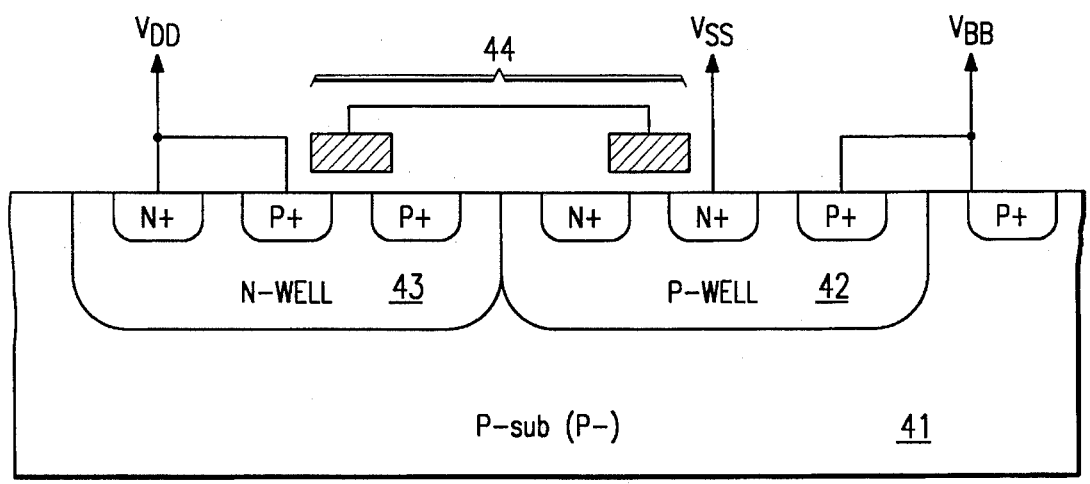
FIG. 4 is a cross-sectional view illustrating a CMOS inverter circuit as an example of the configuration of the semiconductor chip.

FIG. 4 is a diagram illustrating an example of the CMOS inverter circuit as the configuration of the semiconductor chip. As can be seen from FIG. 4, substrate 41 of the dynamic random access memory (DRAM), a type of the semiconductor memory circuit, Usually is of the p-type. In contact with this substrate 41, p-well 42 and n-well 43 are formed. In p-well 42 and n-well 43, various circuits 44, such as input buffer, output buffer, memory cell, sense amplifier, substrate potential generating circuit, etc., are formed. In order to feed power to these various circuits 44, p-well 42 and n-well 43 are connected to power source potential (Vdd), ground potential (Vss), and substrate potential (Vbb) via various power source wiring portions.

Since the power source wiring for feeding power source potential or ground potential is connected to multiple circuits, there is a significant coupling impedance present between the power source wiring and the substrate in the form of the junction capacitance and mutual inductance. Consequently, as the substrate potential varies, the variation in the potential is transferred as noise to the power source wiring via the aforementioned coupling impedance, and the power source potential or the ground potential varies. The variation in the power source potential or ground potential as power source noise causes erroneous operation of the internal circuit of the semiconductor chip. In particular, the input buffer may be easily affected by power source noise.

Figure 5:
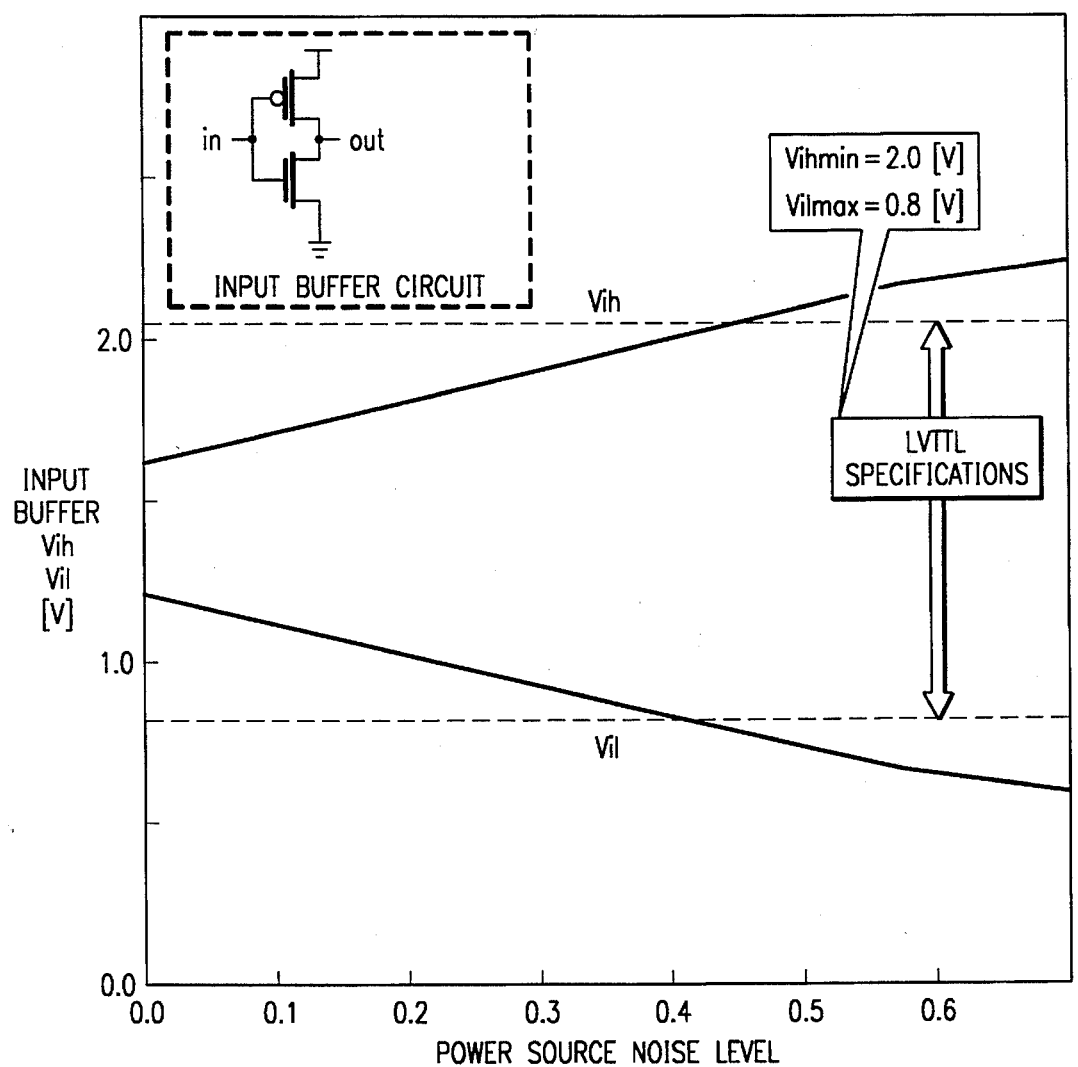
FIG. 5 is a graph illustrating the relation between the power source noise at the input buffer of the DRAM and the input logic level.

FIG. 5 shows the relation between the power source noise level (abscissa) and the input logic level (ordinate) of the DRAM. As shown in FIG. 5, $V_{in}$ is the high-level input logic level of the input buffer, $V_{il}$ is the low-level input logic level of the input buffer. FIG. 5 indicates that there is a linear relation between the power source noise and the logic amplitude of the input logic level. The less power source noise present, the lower the logic amplitude of the input logic level needed. Since low amplitude logic signals are needed for realizing a high operation speed of the circuit, it is very important to reduce the level of power source noise in the design of the DRAM at present.

The largest reason for the variation in the substrate potential is the variation in the current consumption in the semiconductor chip. Since switching operation of the output buffer causes current variations, it is preferred that the power source wiring of the output buffer (for both power source potential and ground potential) be isolated from the power source wiring of the other circuits. Since the input buffer is most susceptible to the influence of noise, it is preferred that this power source wiring (for both power source potential and ground potential) be isolated from the power source wiring of the other circuits. Consequently, usually, the power source wiring (for both power source potential and ground potential) in the DRAM is divided into three portions: for the input buffer, the output buffer, and other circuits. Separation of the power source wiring can be made in the form of connection from the same lead frame to the various power source wiring portions through their respective bonding wires, or in the form of individual power source wiring portions containing the lead frame.

Figure 6A:
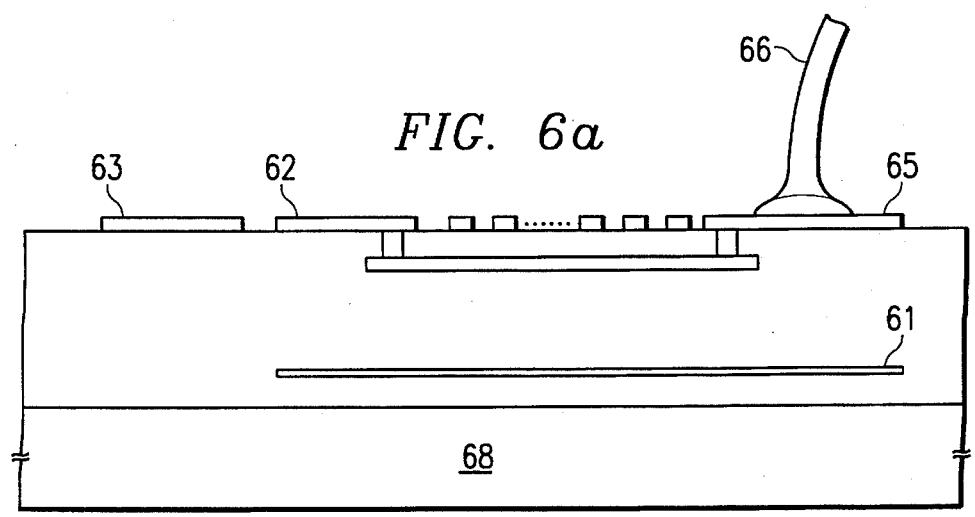

FIGS. 6(a) and 6(b) are schematic diagrams illustrating the principle of this invention. FIG. 6(a) shows a cross-sectional view of the semiconductor chip. FIG. 6(b) shows its equivalent circuit. FIGS. 6(a) and 6(b) illustrate an example of the power source wiring for the ground potential. The power source wiring presented in the following is taken as the power source wiring for the ground potential. A large current flows in power source wiring 63 of the output buffer due to the switch operation of the output buffer. Accompanying this variation in current, noise is generated in power source wiring 63. Power source wiring 63 is connected to lead frame 67 which feeds the ground potential, and there is large junction capacitance 69 between power source wiring 63 and substrate 68 (for simplicity, it is assumed that here the junction capacitance is the only type of coupling impedance); hence, the noise generated in power source wiring 63 is transferred to lead frame 67 and substrate 68 (the arrows in FIG. 6(b) indicate the transfer of noise). Noise transferred via this junction capacitance (69) causes a significant variation in substrate potential. This variation in substrate potential is the noise in substrate 68.

As explained above, the noise caused by the variation in the substrate potential is transferred to power source wiring 62 of the buffer, and causes erroneous operation of the input buffer. In this case, in order to prevent the noise induced by the variation in the substrate potential from being transferred to power source wiring 62, a large shield wiring 61 with a large parasitic electrostatic capacitance 60 with substrate 68 is used (for simplicity, it is assumed here that the electrostatic capacitance is the only type of coupling impedance) so that the noise caused by variation in the substrate potential is absorbed by said shield wiring 61 and is not transferred to power source wiring 62. In this case, shield wiring 61 is connected to lead frame 67, and the noise transferred to shield wiring 61 from substrate 68 is released to the exterior through lead frame 67.

FIGS. 7(a) and 7(b) are diagrams illustrating schematically the principle of this invention. FIG. 7(a) shows the case in which there is no shield wiring 61 between power source wiring 62 and the substrate (noise source) 68. FIG. 7(b) shows the case in which there is shield wiring 61 present between power source wiring 62 and substrate 68. In this case, shield wiring 61 is connected to fixed potential V1 (the ground potential in FIG. 6(b)). In this figure, for simplicity, it is assumed that the electrostatic capacitance is the only type of coupling impedance.

In the case shown in FIG. 7(a), noise is generated in substrate 68. That is, as the substrate potential varies, the potential of node N2 varies. Since capacitor (electrostatic capacitance) C1 maintains the potential difference between node N1 and node N2 at a constant level, as the potential of node N1 varies, the variation in the potential of substrate 68 (noise) is transferred to power source wiring 62.

On the other hand, in the case of FIG. 7(b), variation in the potential of substrate 68 leads to a variation in the potential of node N6, and then a variation in the potential of node N5. However, as shield wiring 61 feeds charge to node N5, variation in the potential of node N5 can be suppressed. That is, if sufficient charge for suppressing the variation in potential of shield wiring 61 is fed by fixed potential V1 connected to shield wiring 61, there is almost no variation in the potential of shield wiring 61. Consequently, there is no variation in potential in nodes N4 and N3, and there is no variation in the potential of power source wiring 62. However, when the charge feeding ability of fixed potential V1 is small, a variation in the potential of substrate 68 leads to a variation in the potential of nodes N5, N4, and N3, and there is only a small variation in the potential of power source wiring 62. However, this variation in potential is smaller than that in the case of no shield wiring 61 as shown in FIG. 7(a).

As explained above, flow of charge to shield wiring 61 or out-flow of charge from shield wiring 61 generates noise; hence, the more stable the potential of shield wiring 61, that is, a fixed potential connected to shield wiring 61, the higher the effect of shielding for shield wiring 61.

For power source wiring 62 of the input buffer, in order to reduce the noise transferred from substrate 68 as much as possible, junction capacitance 69 (coupling impedance) between power source wiring 62 and substrate 68 should be as small as possible, and electrostatic capacitance 60 (coupling impedance) between shield wiring 61 and substrate 68 should be as large as possible. This can be realized, for example, when the distance between shield wiring 61 and substrate 68 is made smaller than the distance between power source wiring 62 and substrate 68, and the width of shield wiring 61 is made larger than the width of power source wiring 62. In order to make the noise transferred from substrate 68 to lead frame 47 efficient, the impedance of shield wiring 61 itself should be as small as possible. For example, shield wiring 62 may be formed from a substance with a low resistivity. In addition, it is preferred that bonding pad 65 for connecting shield wiring 61 to lead frame 67 be set separately.

Here, the voltage applied to shield wiring 61 is a fixed potential applied from outside of the semiconductor device. However, the fixed potential applied to this shield wiring 61 may also be any other type of potential. For example, the potential may be identical to the potential applied to shielded power source wiring 62, or it may be half the power source voltage (Vdd). The more stable this fixed potential, the higher the effect of shielding.

As shown in FIG. 6, shield wiring 61 is connected to lead frame 67 through bonding pad 65 and bonding wire 66, and noise 64 transferred from substrate 68 is sent to the outside through lead frame 67. Since shield wiring 61 is connected to the same lead frame 67 together with power source wiring 62, 63, noise 66 transferred to lead frame 67 circulates and enters the various portions of the wiring. However, this circulating noise has a low level.

When shield wiring 61, input buffer power source wiring 62 and output buffer power source wiring 63 are connected to their respective lead frames, it is possible to reduce the power source noise of power source wiring 62 more effectively.

In this way, since noise transferred from substrate 68 to power source wiring 62 is blocked by shield wiring 61, only the noise from the lead frame becomes the noise transferred to power source wiring 62 of the input buffer, and the power source noise at the input buffer is determined by the noise entering from the lead frame.

In the following description, this invention will be explained in more detail with reference to embodiments thereof.

Figure 2:
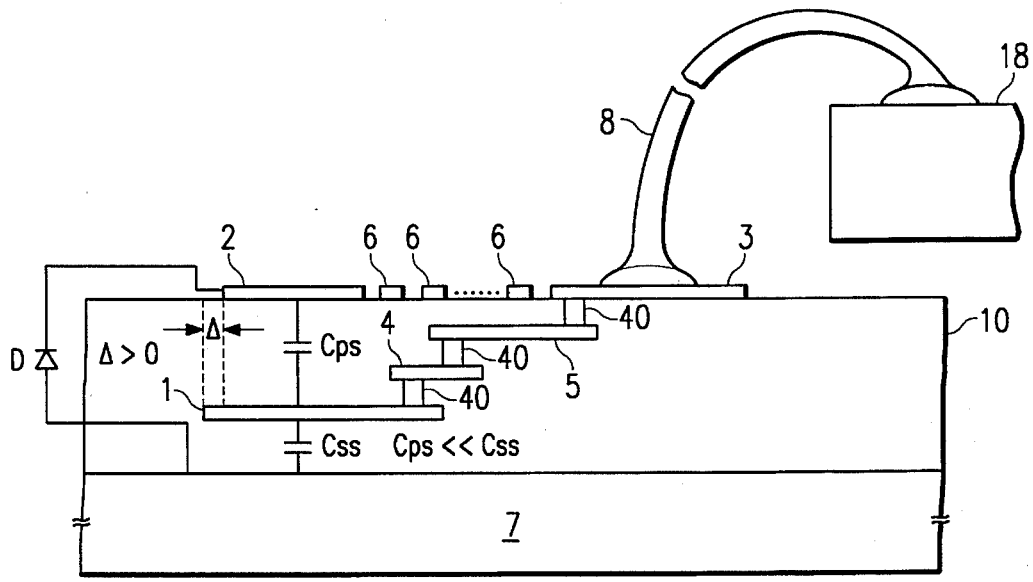
FIG. 2 is a partially diagrammatic cross-section of the embodiment shown in FIG. 1.
Figure 3:
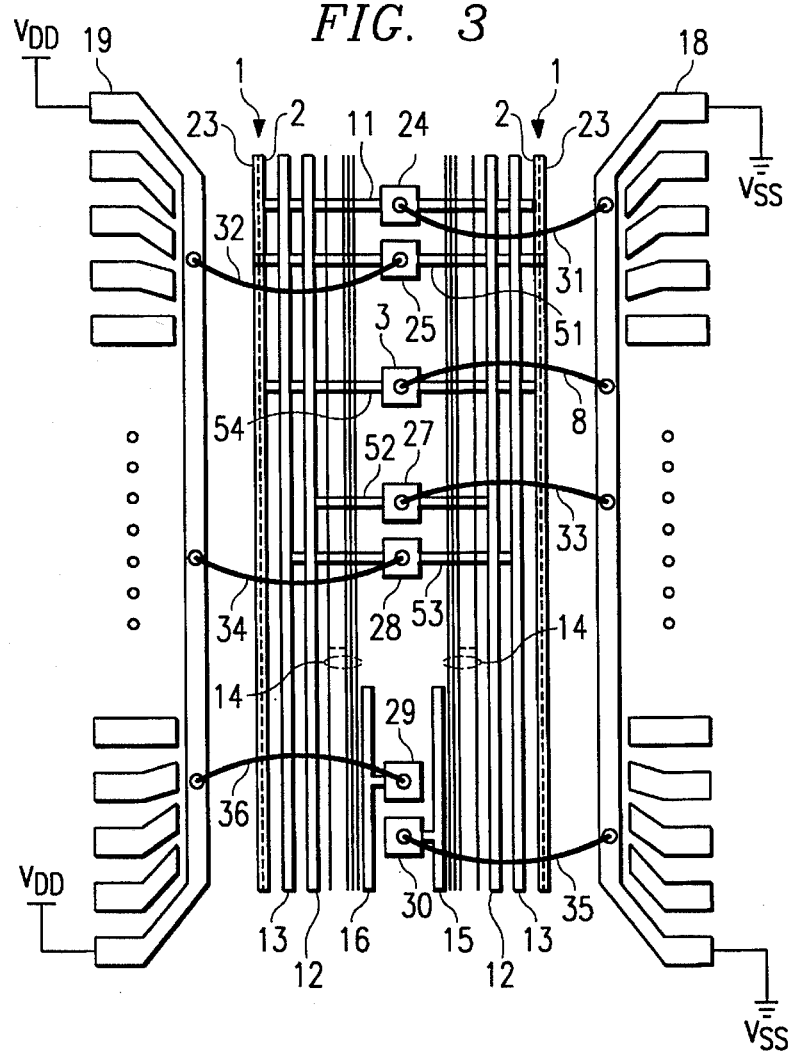
FIG. 3 is a top plan view illustrating the wiring on the semiconductor chip shown in FIG. 1 and the connection between the semiconductor chip and the lead frame.

FIG. 1 illustrates a first embodiment of the semiconductor device of this invention, which is applied to a dynamic random access memory (DRAM). FIG. 2 is a partially diagrammatic cross-section of the embodiment shown in FIG. 1. FIG. 3 illustrates the wiring on the semiconductor chip of the embodiment shown in FIG. 1 and the connection between the semiconductor chip and the lead frame. These diagrams are simplified versions of the actual DRAM, with the memory elements and the peripheral circuits omitted.

With reference to FIG. 3, in this DRAM, the power source of the semiconductor chip is divided into three portions: power source for input buffer, power source for output buffer, and general-purpose power source for other circuits. However, the lead frame is shared by the three portions of the power source (for both the power source potential and the ground potential).

Vss wiring 2 for input buffer (ground potential) is connected to lead frame 18 for ground (Vss) through intra-chip wiring 11, bonding pad (24), and bonding wire 31. Vdd for input buffer (power source potential) is connected to lead frame 19 for power source Vdd) via bonding pad 25 and bonding 32. General-purpose Vss wiring 12 is connected to lead frame 18 via bonding pad 27 and bonding wire 33. General-purpose Vdd wiring 13 is connected to lead frame 19 via bonding pad 18 and bonding wire 34. Vss wiring 15 for output buffer is connected to lead frame 18 via bonding pad 30 and bonding wire 35. Vdd wiring 16 for output buffer is connected to lead frame 19 via bonding pad 19 and bonding wire 36. Shield wiring 1 arranged between substrate 7 and Vss wiring 2 for input buffer is connected to lead frame 18 via intra-chip wiring 54, bonding pad 3 and bonding wire 8.

With reference to FIGS. 1 and 2, Vss wiring 2 for input buffer, channel wiring 6 and bonding pad 3 are formed on the uppermost wiring layer of the semiconductor chip. Shield wiring 1 is formed along Vss wiring 2 between Vss wiring 2 and substrate 7, and it is connected to bonding pad 3 via M1 intra-chip wiring 4 and M2 intra-chip wiring 5. Shield wiring 1 and wiring 5 in M1 chip, M1 intra-chip wiring 4 and M2 intra-chip wiring 5, and M2 intra-chip wiring 5 and bonding pad 3 are connected by connecting parts connecting contacts 40, respectively. Shield wiring 1 forms the first wiring layer, that is, the lowest wiring layer. M1 intra-chip wiring 4 forms the second wiring layer atop the first wiring layer. M2 intra-chip wiring 5 forms the third wiring layer atop the second wiring layer. These first, second and third wiring layers are layers used to form the wiring for connecting the various circuits formed on substrate 7.

In this embodiment, shield wiring 1 is formed from polysilicon, M1 intra-chip wiring 4 and M2 intra-chip wiring 5 from tungsten, and Vss wiring 2, channel wiring 6 and bonding pad 3 from aluminum. In this case, M1 represents the first layer of the metal wiring, and M2 represents the second layer of the metal wiring. Connecting part 40 is made of polysilicon, tungsten, aluminum, or other material. In FIG. 2, an interlayer insulating film 10, which is made of silicon dioxide, is shown. Substrate 7 is a p-type silicon substrate. In addition to the aforementioned substances, other substances may also be used in forming shield wiring 1, M1 intra-chip wiring 4, M2 intra-chip wiring 5, Vss wiring channel wiring 6, bonding pad 3 and connecting part 40.

Channel wiring 6 is a signal line for transferring signals from one circuit block to other circuit blocks on the chip. Usually, on the DRAM chip, circuits with the same function and purpose are collected to form a block, and circuit blocks with different functions are usually arranged far apart. The signal lines for connecting the circuit blocks with different functions are usually made of aluminum with a low resistivity. On the chip, the wiring-dedicated regions known as channels are formed, and the signal lines formed on the channels are called channel wiring.

The electrostatic capacitance between substrate 7 and shield wiring 1, is taken into consideration when determining the coupling impedance. Vss wiring 2 is connected to substrate 7 for sourcing voltage to the circuits on substrate 7. Since there is shield wiring 1 between substrate 7 and Vss wiring 2, the junction capacitance between them may be taken as the coupling impedance between substrate 7 and Vss wiring 2. Also, between shield wiring 1 and Vss wiring 2, there is an electrostatic capacitance Cps as the coupling impedance.

The larger the coupling impedance, the easier it is for the variation in potential or other noise to be transferred. Consequently, it is preferred that electrostatic capacitance Css between shield wiring 1 and substrate 7 be as large as possible, while electrostatic capacitance Cps between Vss wiring 2 and shield wiring 1 be as small as possible. Consequently, it is preferred that the distance between shield wiring 1 and substrate 7 be as small as possible, while the distance between shield wiring 1 and Vss wiring 2 be as large as possible. In order to ensure that the coupling impedance (electrostatic capacitance between Vss wiring 2 and substrate 7 is low, the projection area of shield wiring 1 on substrate 7 is made larger than the projection area of Vss wiring 2, and the projection area of Vss wiring 2 is made not outside the projection area of shield wiring 1 when Vss wiring 2 and shield wiring 1 are projected on substrate 7.

In order to ensure that the noise transferred to shield wiring 1 can escape smoothly to lead frame 18, the self-impedance of shield wiring 1 should be made as small as possible. For M1 intra-chip wiring 4 and M2 intra-chip wiring 5, a small self-impedance is also preferable. That is, the shield effect can be improved as the overall self-impedance of the shield means formed by shield wiring 1, M1 intra-chip wiring 4, M2 intra-chip wiring 5, bonding pad 3, and bonding wire 8 is reduced.

Since the first embodiment has the aforementioned configuration, the noise entering from substrate 7 is transferred to shield wiring 1, while it is not appreciably transferred to Vss wiring 2. As the noise caused by the variation in the potential of substrate 7 is released to lead frame 18, Vss wiring 2 can be protected from the noise from substrate 7. Consequently, the power source noise at Vss wiring 2 ground potential) is determined by the noise from lead frame 18.

In the first embodiment, shield wiring 1 is arranged solely for Vss wiring 2. However, it is also possible that to arranged shield wiring in Vdd wiring 23 so that the power source noise at Vdd wiring 23 (power source potential) is reduced.

Figure 8:
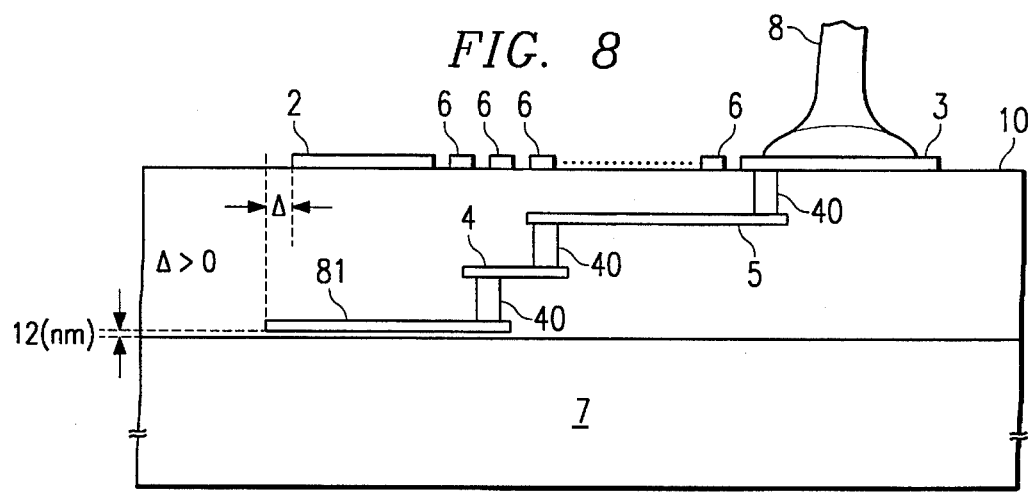
FIG. 8 is a partially diagrammatic cross-section illustrating a second embodiment of the semiconductor device of this invention.

FIG. 8 illustrates a second embodiment of the semiconductor device of this invention. The second embodiment shown in FIG. 8 is a modification of the first embodiment shown in FIGS. 1, 2, and 3, with the position of shield wiring 1 different from that in the first embodiment. In the first embodiment, the shield wiring is formed in the lowest wiring layer, that is, the first wiring layer. On the other hand, in the second embodiment, it is formed in the gate wiring layer where the gates of the transistors are formed. Since the distance between the gate wiring layer and substrate 7 is smaller by an order of magnitude than that of the first wiring layer, the coupling impedance between shield wiring 81 and substrate 7 can be further increased. At present, for the 64 Mb DRAM being developed, the distance between the gate wiring layer and the substrate is about 12 nm.

Just as in the first embodiment, shield wiring 81 is formed by polysilicon in the second embodiment of FIG. 8. The configuration is the same as that of the first embodiment, except for the position of shield wiring 81.

Figure 9:
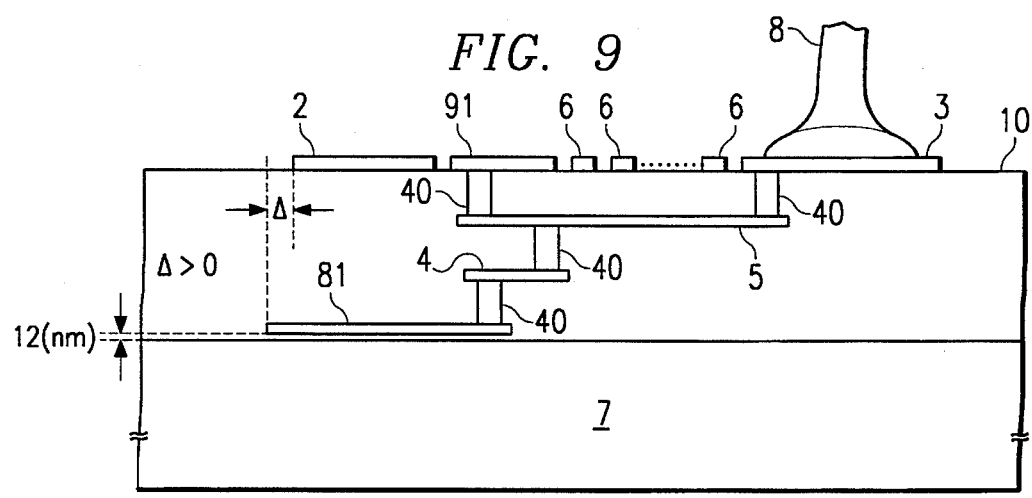
FIG. 9 is a partially diagrammatic cross-section illustrating a third embodiment of the semiconductor device of this invention.

FIG. 9 illustrates a third embodiment of the semiconductor device of this invention. The third embodiment is a modification of the second embodiment shown in FIG. 8, with a shield reinforcing wiring 91 added on the upper most wiring layer. This shield reinforcing wiring 91 is made of aluminum, and it is connected to M2 intra-chip wiring 5 via connecting part 40.

Channel wiring 6 is wiring for connecting circuit blocks located at separate positions on the chip. Since the distance for transferring the signal is long, a large current is used for driving. When Vss wiring 2 and channel wiring 6 are near each other, electrostatic capacitance as coupling impedance is present between these two wiring portions. Consequently, when logic variations take place at channel wiring 6, those logic variations are transferred to Vss wiring 2 via the electrostatic capacitance between Vss wiring 2 and channel wiring 6, causing variations in the potential of Vss wiring 2. That is, the logic variations in channel wiring 6 become a noise source of Vss wiring 2. Consequently, in the third embodiment shown in FIG. 9, in addition to shield wiring 1, a shield reinforcing wiring 91 is arranged between Vss wiring 2 and channel wiring 8, and transfer of noise from channel wiring 6 to Vss wiring 2 can be prevented.

This shield reinforcing wiring 91 is formed continuously between Vss wiring 2 and channel wiring 6, and the basic principle of the shielding effect is identical to that of shield wiring 1. Although the noise transferred from channel wiring 6 to Vss wiring 2 is smaller than the noise transferred from substrate 7 to Vss wiring 2, by means of a combination of shield wiring 81 and shield reinforcing wiring 91, a larger shielding effect than that in the second embodiment of FIG. 8 can be realized. Also, the smaller the self-impedance of shield reinforcing wiring 91, the more stable the potential of shield reinforcing wiring 91, and the better the shielding effect.

In the third embodiment, shield reinforcing wiring 91 is formed only on one side of Vss wiring 2 (the right-hand side of FIG. 9. However, the shielding effect can be further improved when the shield reinforcing wiring is formed on both sides of Vss wiring 2. In the aforementioned embodiment, shield reinforcing wiring 91 is connected to M2 intra-chip wiring 5 via connecting part 40. However, it is also possible to arrange individual wiring for shield reinforcing wiring 91.

Figure 10:
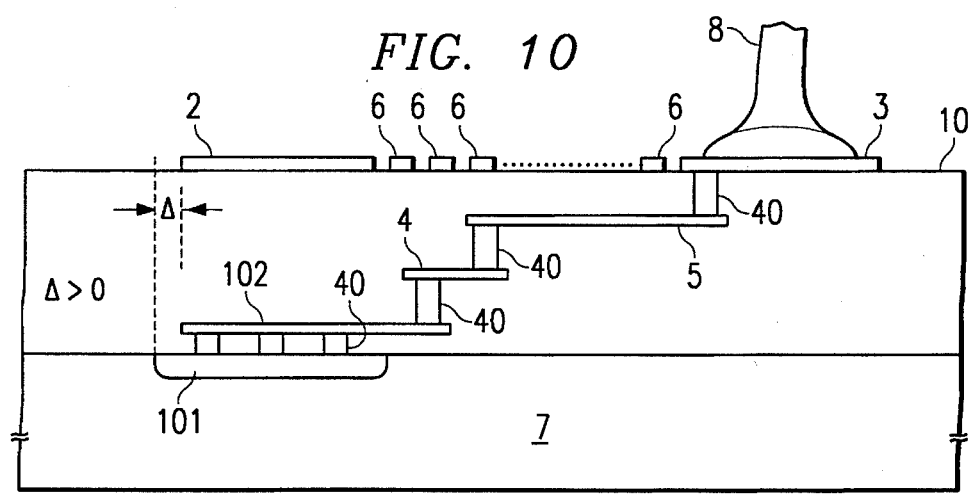
FIG. 10 is a partially diagrammatic cross-section illustrating a fourth embodiment of the semiconductor device of this invention.

FIG. 10 illustrates a fourth embodiment of the semiconductor device of this invention. In the fourth embodiment, the shield wiring is realized by arranging a diffusion layer on substrate 7. Diffusion layer shield wiring 101, the shield wiring, is connected to bonding pad 3 via polysilicon intra-chip wiring 102, M1 intra-chip wiring 4 and M2 intra-chip wiring 5. Substrate 7 is a p-type silicon substrate, and diffusion layer shield wiring 101 is an n-type diffusion layer. In this case, diffusion layer shield wiring 101 is connected to polysilicon intra-chip wiring 102, polysilicon intra-chip wiring 102 is connected to M1 intra-chip wiring 4, M1 intra-chip wiring 4 is connected to M2 intra-chip wiring 5, and M2 intra-chip wiring 5 is connected to bonding pad 3, by means of connecting parts 40.

The configuration other than the portions of diffusion layer shield wiring 101 and polysilicon intra-chip wiring 102 is identical to the one shown in the first embodiment, and just as in the first embodiment, polysilicon intra-chip wiring 102 is formed on the first wiring, that is, the lowest wiring layer.

This diffusion layer shield wiring 102 is formed continuously in the longitudinal direction of Vss wiring 2. Just as in the embodiment shown in FIG. 1, the area of diffusion layer shield wiring 101 is made larger than the projection area of Vss substrate 2 to substrate 7 so that the projection area of Vss wiring 2 does not exceed diffusion layer shield wiring 101 when Vss wiring 2 is projected onto substrate 7, to ensure that the coupling impedance (electrostatic capacitance) between Vss wiring 2 and substrate 7 is low.

There is no requirement to form the polysilicon intra-chip wiring 102 continuously in the longitudinal direction of Vss wiring 2 as for diffusion layer shield wiring 101. However, in order to stabilize the potential of diffusion layer shield wiring 101, it is preferred that these two wirings be connected by as many electrical feed contacts (connecting parts 40) as possible. Consequently, it is preferred that polysilicon intra-chip wiring 102 be formed continuously in the longitudinal direction of Vss wiring 2, with many electrical feed contacts (connecting parts 40).

For the configuration presented above, there is a large junction capacitance as coupling impedance between diffusion layer shield wiring 101 and substrate 7. Noise caused by the variation in the substrate potential is absorbed by diffusion layer shield wiring 101, and it is not appreciably transferred to Vss wiring 2. In the fourth embodiment of FIG. 10, too, the smaller the self-impedance of the shielding means, the better the shielding effect.

Figure 11:
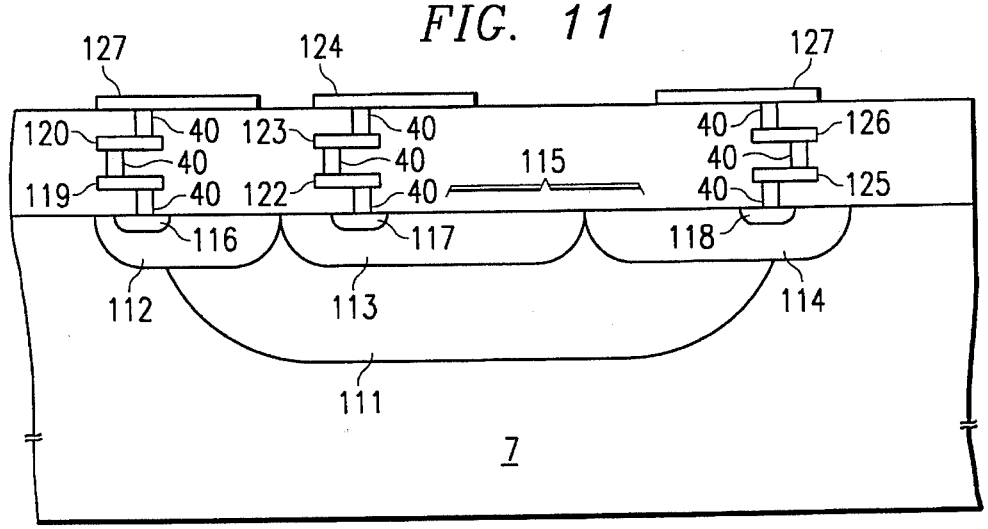
FIG. 11 is a partially diagrammatic cross-section illustrating a fifth embodiment of the semiconductor device of this invention.

FIG. 11 illustrates a fifth embodiment of the semiconductor device of this invention. In the fifth embodiment, the purpose is to reduce the transfer of noise from substrate 7 to circuit region 115. In DRAM, each circuit is formed on n-well 114 and p-well 113 formed on p-type silicon substrate 7. Consequently, in the case of direct contact between n-well 114 and p-well 113 having circuit region 115 and substrate 7, the noise generated at substrate 7 is directly transferred to n-well 114 and p-well 113, and the circuit on the wells is adversely affected by the noise. In the fifth embodiment of FIG. 11, a D-well (a well of n electroconductive type) 111 is formed between substrate 7 and n-wells 112, 114, and p-well 113, and the noise generated at substrate 7 is difficult to transfer to circuit configuration region 115.

The n-well 112 is connected to Vdd wiring 121 for feeding the power source potential via n-type diffusion layer ($n^+$) 116, M1 intra-chip wiring 119, and M2 intra-chip wiring 120. The p-well 113 is connected to Vss wiring 124 feeding the ground potential via P-type diffusion layer ($p^+$) 117, M1 intra-chip wiring 122, and M2 intra-chip wiring 123. The n-well 114 is connected to Vdd wiring 127 for feeding the power source potential via N-type ($n^+$) diffusion layer 118, M1 intra-chip wiring 125, and M2 intra-chip wiring 126, just as in the case of n-well 112. Connection between diffusion layer and wiring and between wiring and wiring is performed by connecting parts 40. Here, M1 indicates the first layer of the metal wiring, and M2 indicates the second layer of the metal wiring. In the fifth embodiment of FIG. 11, wiring in M1 intra-chip wiring and wiring in M2 intra-chip wiring are forged by tungsten.

The D-well 111 is formed by using n-wells 112, 114, and p-well 113 to surround it.

As the concentration of the impurity in D-well 111 is arranged on a low level., the junction capacitance between D-well 111 and substrate 7 is small, that is, the coupling impedance between D-well 111 and substrate 7 is low. Also, the internal resistance value of D-well 111 is high. Consequently, the noise generated at substrate 7 is difficult to transfer to D-well 111, and the noise transferred from substrate 7 to n-well 114 and p-well 113 via D-well 111 can be reduced.

In this way, by arranging D-well [1] between circuit-forming n-well 114 and p-well 113 and substrate 7, the coupling impedance between n-well 114 and p-well 113 and substrate 7 can be reduced, and the noise transferred from substrate 7 to n-well 114 and p-well 113 can be reduced. Consequently, it is possible to prevent erroneous operation of the circuit in circuit region 115 due to the noise generated at substrate 7.

In the fifth embodiment, since d-well 111 is arranged between n-well 114 and p-well 113 having circuit configuration region 115 and substrate 7, it is possible to apply power source Vdd directly to n-wells 112, 114, and it is possible to apply ground potential Vss to p-well 113. Consequently, the well potential becomes very stable, noise can be suppressed well, and the circuit operation can be performed at high speed.

Also, since the circuit that may become a source of noise is isolated by means of the pseudo-isolation of the substrate due to well separation, the level of the noise generated can be reduced.

Figure 13:
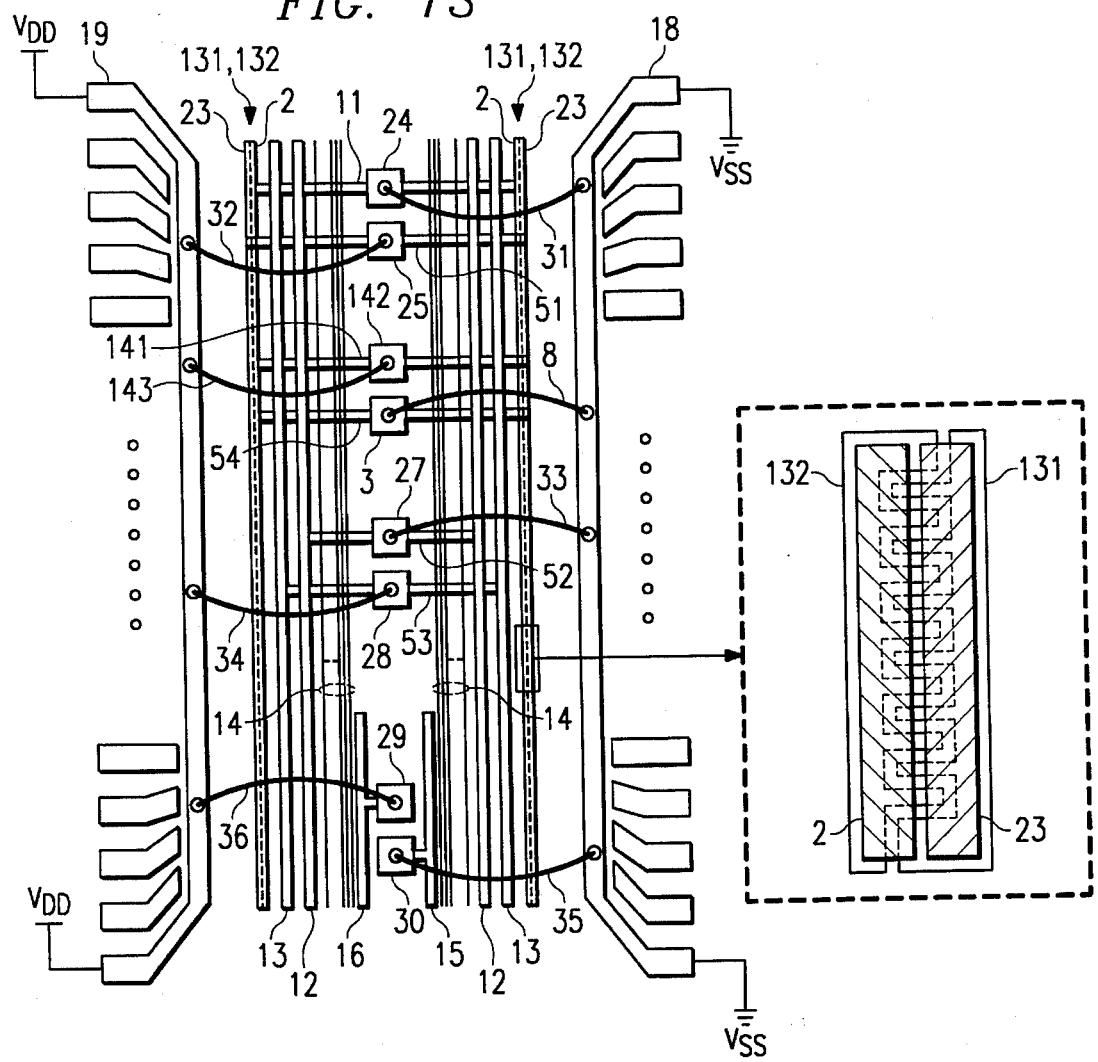
FIG. 13 is a top plan view with an enlarged inset illustrating wiring on the semiconductor chip in the sixth embodiment shown in FIG. 12 and the connection with the lead frame.
Figure 12:
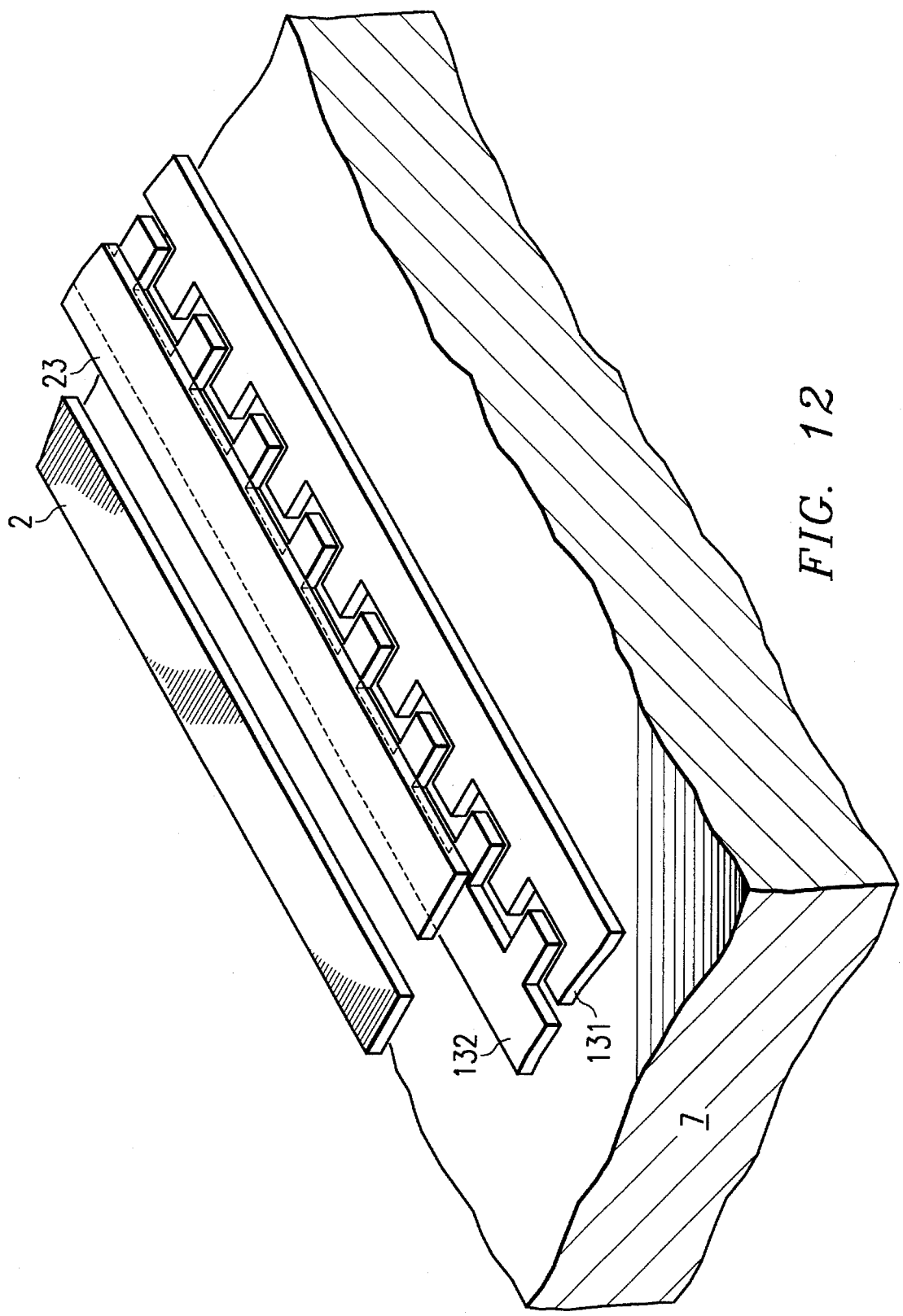
FIG. 12 is a fragmentary perspective view illustrating a sixth embodiment of the semiconductor device of this invention.

FIG. 12 illustrates a sixth embodiment of the semiconductor device of this invention. FIG. 13 illustrates the wiring on the semiconductor chip in the sixth embodiment and the connection between the semiconductor chip and the lead frame. In the sixth embodiment, just as in the aforementioned embodiment, this invention is applied to the DRAM, and shield wiring is arranged for both Vdd wiring for sourcing the power supply potential and Vss wiring for feeding the ground potential.

The wiring method in the sixth embodiment of FIG. 12 may be explained with reference to FIG. 13. For the power source of the semiconductor chip in the sixth embodiment, just as in the case of the first embodiment shown in FIG. 3, it is also divided into three portions, namely, power source for input buffer, power source for output buffer, and general-purpose power source. However, the lead frame is shared by the three power source portions.

Shield wiring 131 for feeding the ground potential is connected to lead frame 18 for ground (Vss) via intra-chip wiring 54, bonding pad 3, and bonding wire 8. Shield wiring 132 for supplying power source voltage Vdd is connected to power source Vdd) lead frame 19 via intra-chip wiring 141, bonding 142, and bonding wire 143. The other wirings are identical to those in the first embodiment shown in FIG. 3.

Also, just as in the first embodiment as shown in FIG. 1, these shield wirings 131, 132 are formed by polysilicon.

As explained above, the shield efficiency can be improved as the potential of the shield wiring is more stable. Consequently, in the sixth embodiment, there are two shield wirings, namely, shield wiring for Vss wiring 2 and shield wiring for Vdd wiring 23. These two shield wirings 131, 132 are formed so that a large parasitic capacitance is formed between the two shield wirings. In this way, the potential of shield wirings 131, 132 is stabilized. In this embodiment, Vss potential is applied to shield wiring 131, and Vdd potential is applied to shield wiring 132. However, these potentials may be reversed.

In the sixth embodiment, too, it is preferred that the coupling impedance between shield wirings 131, 132 and substrate 7 be large. Consequently, the distance between shield wirings 131, 132 and substrate 7 should be small. In addition, the self-impedance of shield wirings 131, 132 should be low.

The semiconductor device of this invention has been described as a dynamic random access memory (DRAM), as an example. However, this invention may also be applied to other types of semiconductor devices. For example, it may be applied to a microprocessor (MPU), a static random access memory (SRAM), etc. The described embodiments are only examples, since other configurations and substances may be used to implement this invention in various forms based on the technological concepts of the invention.

In a semiconductor device in accordance with this invention, shield wiring with a large coupling impedance to the semiconductor substrate is arranged between the power source and semiconductor substrate. Consequently, the noise generated at the semiconductor substrate due to variation in the potential of the semiconductor substrate is absorbed by the shield wiring, and no noise generated at the semiconductor substrate is transferred to the power source wiring.

Also, in the semiconductor device of this invention, a shielding region (d-well) with a small coupling impedance with the semiconductor substrate is arranged between the circuit region, on which multiple circuit elements are arranged, and the semiconductor substrate. Consequently, the noise generated at the semiconductor substrate due to variation in the potential of the semiconductor substrate is blocked by the shielding region, and thus is not transferred to the circuit region. Consequently, the semiconductor device of this invention has the effect that the design of circuits not susceptible to noise from the input circuit, etc., is facilitated.

We claim:

1. A semiconductor device comprising:
   a semiconductor substrate having an upper surface and being of one conductivity type;
   an insulating layer disposed on the upper surface of said substrate;
   a plurality of wiring layers including at least one wiring layer arranged on said insulating layer and at least one wiring layer embedded in said insulating layer in stacked insulated relation with respect to each other;
   electrical connectors extending between adjacent wiring layers at particular locations thereon to selectively electrically interconnect respective regions of the adjacent wiring layers;
   said plurality of wiring layers being patterned to define at least a power source wiring conductor disposed in spaced relation to said substrate;
   a shield wiring conductor embedded in said insulating layer and disposed in a position in spaced registering relationship with said power source wiring conductor and between said substrate and said power source wiring conductor;
   the distance between said shield Wiring conductor and said substrate being smaller than the distance between said shield wiring conductor and said power source wiring conductor such that the electrostatic capacitance between said shield wiring conductor and said substrate is relatively large and the electrostatic capacitance between said power source wiring conductor and said shield wiring conductor is relatively small; and
   means connected to said shield wiring conductor for applying a fixed potential to said shield wiring conductor of a magnitude enabling said shield wiring conductor to suppress power source noise.

2. A semiconductor device as set forth in claim 1, wherein said fixed potential-applying means connected to said shield wiring conductor is a portion of a lead frame maintained at a fixed potential.

3. A semiconductor device as set forth in claim 1, wherein said power source wiring conductor is maintained at ground potential; and
   said fixed potential-applying means connected to said shield wiring conductor maintains said shield wiring conductor at ground potential.

4. A semiconductor device as set forth in claim 1, wherein said power source wiring conductor is maintained at a power source potential corresponding to the power source voltage; and
   said fixed potential-applying means connected to said shield wiring conductor providing a potential to said shield wiring conductor other than ground potential.

5. A semiconductor device as set forth in claim 1, wherein said plurality of wiring layers have at least first and second power source wiring conductors respectively supplying a supply voltage and a ground potential and disposed in spaced relation to said substrate;

first and second shield wiring conductors embedded in said insulating layer and disposed in respective positions in spaced registering relationship with said first and second power source wiring conductors and between said substrate and said first and second power source wiring conductors;

the distance between each of said first and second shield wiring conductors and said substrate being smaller than the distance between the respective one of said first and second shield wiring conductors and the one of said first and second power source wiring conductors corresponding thereto such that the electrostatic capacitance between each of said first and second shield wiring conductors and said substrate is relatively large and the electrostatic capacitance between said first and second power source wiring conductors and said first and second shield wiring conductors corresponding thereto is relatively small; and first and second fixed potential-applying means respectively connected to said first and second shield wiring conductors for applying fixed potentials of differing magnitudes to said first and second shield wiring conductors enabling said first and second shield wiring conductors to respectively suppress power source noise.

6. A semiconductor device as set forth in claim 1, wherein the width of said shield wiring conductor is greater than the width of said power source wiring conductor.

7. A semiconductor device as set forth in claim 1, wherein one of the plurality of wiring layers is a gate wiring layer patterned to define the gates of respective transistors and embedded in said insulating layer in closely spaced relationship to said substrate; and said shield wiring conductor being defined in said gate wiring layer.

8. A semiconductor device as set forth in claim 7, further including channel wiring conductors arranged in spaced relationship to said power source wiring conductor disposed on said insulating layer; and a shield reinforcing wiring conductor disposed on said insulating layer at a position between said power source wiring conductor and said channel wiring conductors to suppress the transfer of noise from the channel wiring conductors to said power source wiring conductor.

9. A semiconductor device comprising:

a semiconductor substrate having an upper surface and being of one conductivity type;

an insulating layer disposed on the upper surface of said substrate;

a plurality of wiring layers including at least one wiring layer arranged on said insulating layer and at least one wiring layer embedded in said insulating layer in stacked insulated relation with respect to each other;

electrical connectors extending between adjacent wiring layers at particular locations thereon to selectively electrically interconnect respective regions of the adjacent wiring layers;

said plurality of wiring layers being patterned to define at least a power source wiring conductor disposed on said insulating layer in spaced relation to said substrate;

a diffusion region having a dopant impurity of the opposite conductivity type to said one conductivity type of said substrate provided in said substrate and opening onto the upper surface thereof in registration with said power source wiring conductor disposed on said insulating layer, said diffusion region defining a shield wiring conductor and being disposed in a position in spaced registering relationship with said power source wiring conductor and between said substrate and said power source wiring conductor; and means connected to said diffusion region defining said shield wiring conductor for applying a fixed potential to said shield wiring conductor of a magnitude enabling said shield wiring conductor to suppress power source noise.

10. A semiconductor device as set forth in claim 5, wherein said first shield wiring conductor is an elongated strip having a plurality of spaced fingers thereon, and said second shield wiring conductor is an elongated strip having a plurality of spaced fingers thereon intermeshing with the fingers of said first elongated strip shield wiring conductor but in spaced relationship with respect thereto;

said first and second elongated strip shield wiring conductors having parasitic capacitance formed therebetween for stabilizing the respective potentials of said first and second elongated strip shield wiring conductors.

* * * * *